United States Patent
Wu et al.

(10) Patent No.: US 8,319,429 B2
(45) Date of Patent: Nov. 27, 2012

(54) LIGHT EMITTING DIODE MODULE HAVING A GROUND LEAD

(75) Inventors: Wei-Hung Wu, Kaohsiung (TW); Hung-Chuo Lee, Yilan County (TW)

(73) Assignee: Au Optronics Corporation, Hsinchu (TW)

(*) Notice: Subject to any disclaimer, the term of this patent is extended or adjusted under 35 U.S.C. 154(b) by 0 days.

(21) Appl. No.: 13/008,017

(22) Filed: Jan. 18, 2011

(65) Prior Publication Data

US 2012/0057358 A1    Mar. 8, 2012

(30) Foreign Application Priority Data

Sep. 8, 2010 (TW) .............................. 99130389 A

(51) Int. Cl.
*H01J 1/62* (2006.01)
*H01J 63/04* (2006.01)
(52) U.S. Cl. ......................................... 313/512; 257/99
(58) Field of Classification Search .................. 313/498, 313/512; 257/99; 362/382
See application file for complete search history.

(56) References Cited

U.S. PATENT DOCUMENTS

| | | | |
|---|---|---|---|
| 2008/0169750 A1* | 7/2008 | Kim et al. | 313/498 |
| 2009/0135364 A1* | 5/2009 | Lee et al. | 349/149 |
| 2009/0185393 A1* | 7/2009 | Kang et al. | 362/612 |
| 2009/0290273 A1* | 11/2009 | Shih et al. | 361/56 |

FOREIGN PATENT DOCUMENTS

| | | | |
|---|---|---|---|
| CN | 101118051 | | 2/2008 |
| JP | 59-151379 | | 8/1984 |
| JP | 11340515 | A * | 12/1999 |
| JP | 2009076949 | A * | 4/2009 |
| TW | 200801679 | | 1/2008 |

OTHER PUBLICATIONS

Machine English Translation of JP 11340515A to Izuno et al. Dec. 1999.*
Machine English Translation of JP 2009076949 A Apr. 2009.*

* cited by examiner

*Primary Examiner* — Mariceli Santiago
*Assistant Examiner* — Glenn Zimmerman
(74) *Attorney, Agent, or Firm* — Jianq Chyun IP Office

(57) ABSTRACT

A light emitting diode (LED) module including a circuit board and at least one LED package is provided. The circuit board has a plurality of driving signal wirings and at least one ground wiring. The LED package is disposed on the circuit board and is electrically connected to the driving signal wirings. The LED package includes at least one LED chip, a plurality of signal leads, and at least one ground lead. The signal leads are electrically connected to the LED chip. The ground lead is electrically insulated from the signal lead and is electrically connected to the ground wiring. The ground lead is electrically insulated from the LED chip and has favorable electrostatic discharge (ESD) protection performance.

6 Claims, 4 Drawing Sheets

LIGHT EMITTING DIODE MODULE HAVING A GROUND LEAD

CROSS-REFERENCE TO RELATED APPLICATION

This application claims the priority benefit of Taiwan application serial no. 99130389, filed on Sep. 8, 2010. The entirety of the above-mentioned patent application is hereby incorporated by reference herein and made a part of this specification.

BACKGROUND OF THE INVENTION

1. Field of the Invention

The invention generally relates to a light emitting device, and more particularly, to a light emitting diode (LED) module.

2. Description of Related Art

Since light emitting diodes (LEDs) have advantages such as low power consumption and high brightness, LEDs are widely used in different fields, such as displays, lighting, and indicating lights. In addition, in the established color gamut of the National Television Standard Committee (NTSC), LEDs also have excellent color space. Thus, LEDs have gradually replaced cold cathode fluorescent lamps (CCFLs), becoming one of the major parts in a backlight module of display panels.

Taking the current popular liquid crystal display as an example, an LED backlight is already gradually becoming a mainstream product. In the LED backlight fabrication process, accumulation and discharge of static electricity from workers or machines are inevitable. The static electricity discharges electricity to an LED package through lower resistance routes, and causes the LED chip in the LED package to be damaged because of the discharged static electricity. In conventional technology, many prevention designs to avoid LED chips from being damaged by the discharged electricity are brought up, one of which is shown in FIG. 1.

FIG. 1 is a schematic view of a conventional LED module. Referring to FIG. 1, the conventional LED module includes a circuit board 100 and an LED package 200. The circuit board 100 comprises a plurality of driving signal wirings 102 and a ground wiring 104. The LED package 200 comprises two signal leads 202, an LED chip 206, a transparent encapsulation member 208a, an opaque encapsulation member 208b, and a bonding wire 210. The LED chip 206 is electrically connected to the driving signal wirings 102 through the signal leads 202 and the bonding wire 210. The ground wiring 104 is disposed only on all edges of the circuit board 100 and surrounds the LED package 200. Since the ground wiring 104 is capable of transmitting the static electricity out of the circuit board 100 along the lateral direction (x-y plane), it is difficult for the static electricity to enter the LED package 200, and thereby protecting the LED chip 206.

However, since the thickness of display panels and similar products are gradually made thinner, borders of the display panels are made narrower, and the circuit board 100 of the LED package must also be made smaller. Following the trend, the arrangement area of the ground wiring 104 is reduced, causing the ground wiring 104 to be unable to completely surround the LED package 200. In addition, when the static electricity is not discharged along the lateral direction (x-y plane), such as when the static electricity is discharged along the vertical direction (z-axis direction), the static electricity enters the LED package 200 from a signal lead which is higher than the ground wiring 104, and causes damage to the LED chip 206. In other words, the static electricity protection design shown in FIG. 1 is limited to prevent the damage caused by static electricity discharged along x-y plane (or namely two-dimensional protection), and is unable to achieve a three-dimensional protection (or namely x-y-z space). Thus, how to effectively reduce the probability of damage resulted from the static electricity discharge has become an important issue to be solved.

SUMMARY OF THE INVENTION

The invention provides an LED module having a favorable electrostatic discharge (ESD) protection effect.

The invention provides an LED module comprising a circuit board and at least one LED package. The circuit board comprises a plurality of driving signal wirings and at least one ground wiring. The LED package is disposed on the circuit board and is electrically connected to the driving signal wirings. The LED package includes at least one LED chip, a plurality of signal leads, and at least one ground lead. The signal leads are electrically connected to the LED chip. The ground lead is electrically insulated from the signal lead and is electrically connected to the ground wiring.

In an embodiment of the invention, the driving signal wirings include a first driving signal wiring and a second driving signal wiring. In detail, the signal leads comprise a first signal lead and a second signal lead. The first signal lead is electrically connected to the first driving signal wiring, and the second signal lead is electrically connected to the second driving signal wiring.

In an embodiment of the invention, the LED package can further comprise a encapsulation member. The encapsulation member encapsulates the LED chip, a partial area of the signal leads, and a partial area of the ground leads.

In an embodiment of the invention, the partial area of each of the signal leads not encapsulated by the encapsulation member comprises a first extending part and a second extending part. The first extending part extends downwards from the side wall of the encapsulation member. The second extending part is connected with the first extending part and extends laterally. The second extending part is electrically connected with the driving signal wiring.

In an embodiment of the invention, the partial area of each of the ground leads not encapsulated by the encapsulation member comprises a third extending part and a fourth extending part. The third extending part extends downwards from the side wall of the encapsulation member. The fourth extending part is connected with the third extending part and extends laterally. The fourth extending part is electrically connected with the ground wiring.

In an embodiment of the invention, the resistance of the ground lead is lower than the resistance of each signal lead.

In an embodiment of the invention, the amount the ground leads is greater or equal to two.

In an embodiment of the invention, the LED package further comprises a flexible printed circuit electrically connected to the ground wiring.

In an embodiment of the invention, the ground lead is electrically insulated from the LED chip.

According to the aforementioned, the invention uses the ground lead electrically insulated to the signal lead, to guide the non-laterally transmitted static electricity to the ground terminal, causing difficulty for the non-laterally transmitted static electricity to enter the LED package.

In order to make the aforementioned and other objects, features and advantages of the disclosure comprehensible, embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
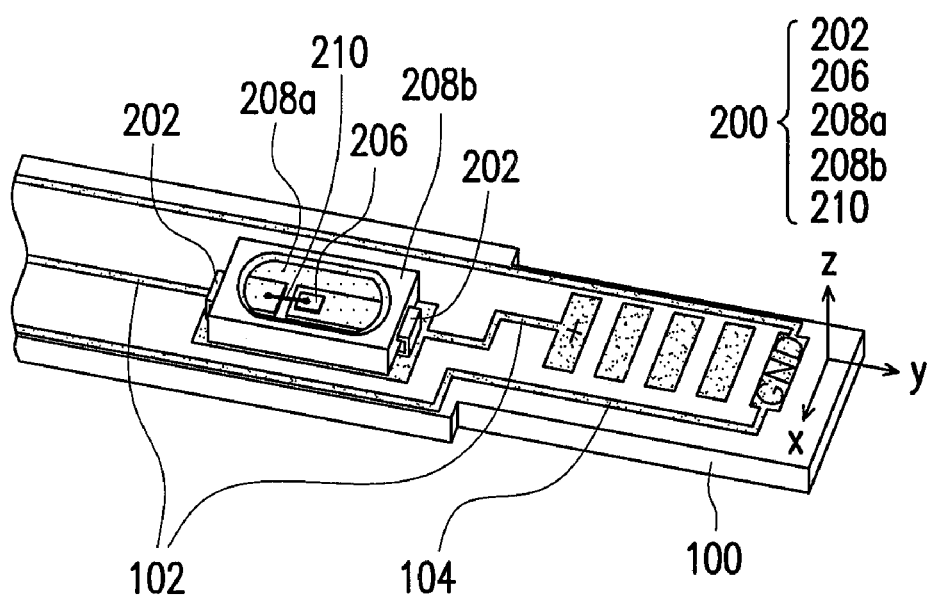
FIG. 1 is a schematic view of a conventional LED module.
Figure 2A:
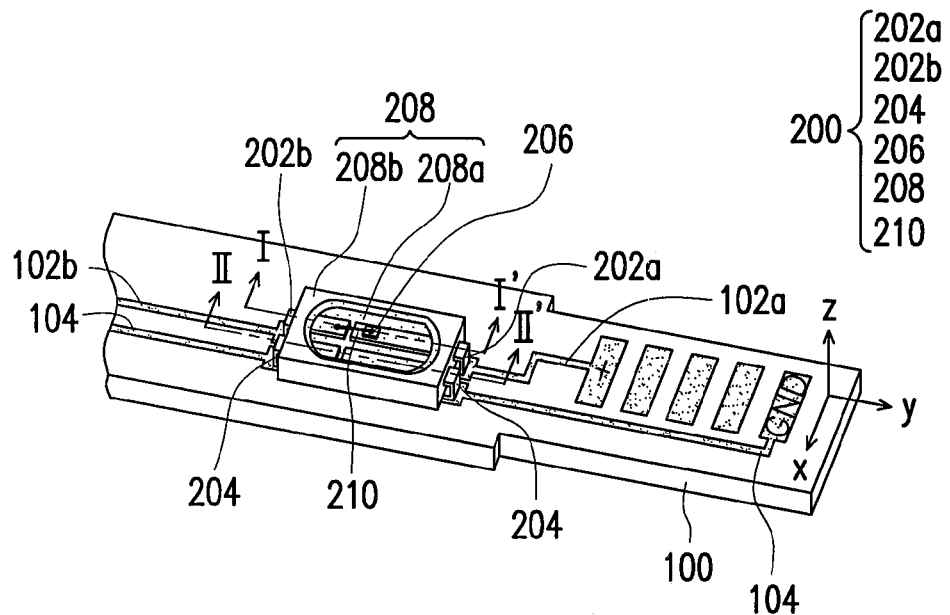
FIG. 2A is a three-dimensional schematic view of an LED module according to an embodiment of the invention.
Figure 2B:
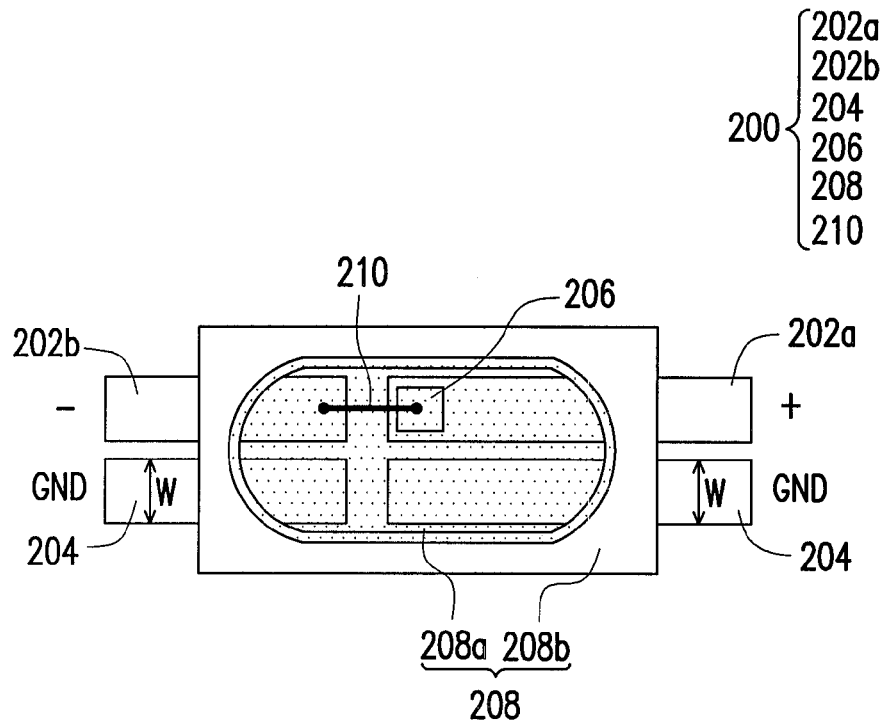
FIG. 2B is a top view illustrating an LED package according to an embodiment of the invention.
Figure 2C:
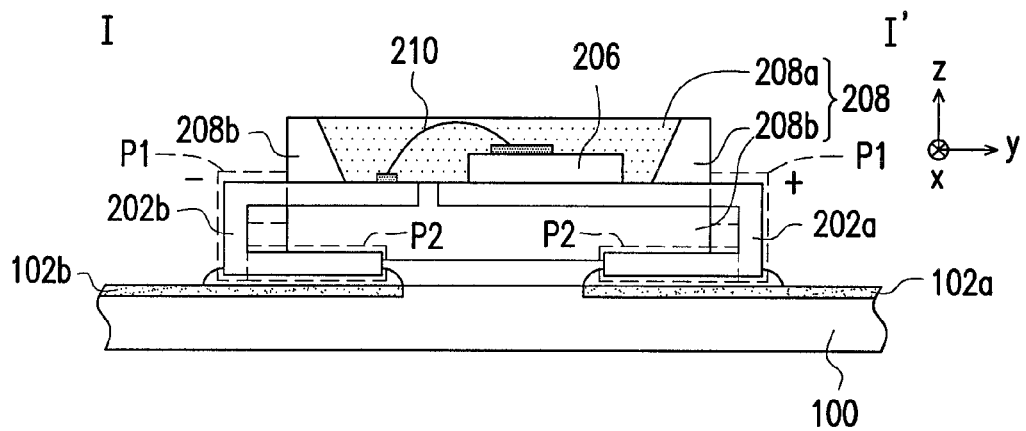
FIG. 2C is a schematic cross-sectional view taken along a line I-I' depicted in FIG. 2A.
Figure 2D:
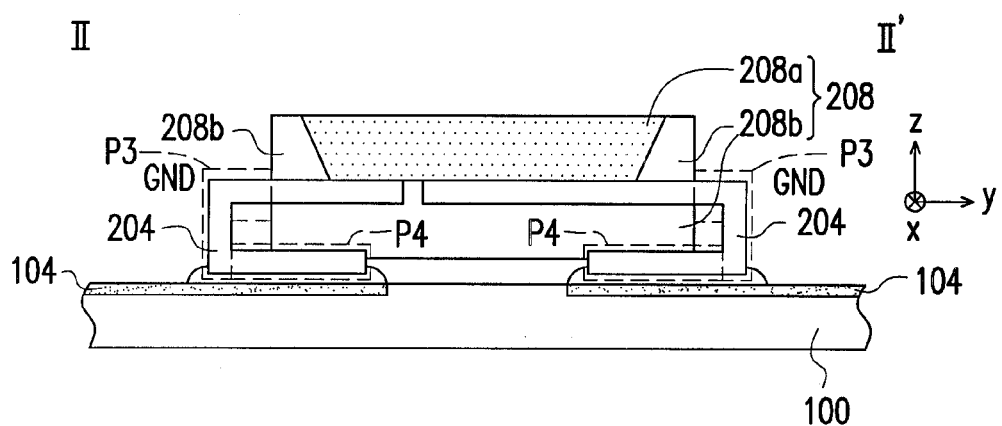
FIG. 2D is a schematic cross-sectional view taken along a line II-II' depicted in FIG. 2A.

FIG. 2A is a three-dimensional schematic view of an LED module according to an embodiment of the invention. FIG. 2B is a top view illustrating an LED package according to an embodiment of the invention. FIG. 2C is a schematic cross-sectional view taken along a line I-I' depicted in FIG. 2A. FIG. 2D is a schematic cross-sectional view taken along a line II-II' depicted in FIG. 2A.

Referring to FIGS. 2A and 2B, the LED module of the embodiment includes a circuit board 100 and at least one LED package 200 (the embodiment only shows one LED package). It should be noted that the LED module of the embodiment can include two or more LED packages 200. For example, the LED module can include a plurality of LED packages 200 connected in series.

In the embodiment, the circuit board 100 comprises a first driving signal wiring 102a, a second driving signal wiring 102b, and two ground wirings 104. The circuit board 100 is a rigid printed circuit board, for example. Generally, the circuit board 100 may be an FR-4 printed circuit board, an FR-5 printed circuit board, a metal-core printed circuit board (MCPCB), and so on. In another embodiment, the circuit board 100 may be a flexible circuit board. The invention does not limit the type of the circuit board 100.

In the embodiment, the LED package 200 comprises a first signal lead 202a, a second signal lead 202b, two ground leads 204, an LED chip 206, and a bonding wire 210. However, in another embodiments, the amount of the signal leads 202, the amount of the ground leads 204, and the amount of the LED chips 206 in the LED package 200 can be designed according to actual requirements and can be adjusted appropriately. The amounts of the LED chips 206 in the LED package 200 can be one or more than one. For example, an LED package 200 is a multi-chips white light LED package comprising three LED chips (for example a red LED chip, a green LED chip, and a blue LED chip), four signal leads, and two ground leads.

In the embodiment, the LED chip 206 is, for example, a GaN-based compound semiconductor that emits ultraviolet rays or blue light. The positive electrode (+) is electrically connected with the first signal lead 202a, and the negative electrode (−) is electrically connected with the second signal lead 202b through the bonding wire 210. In the embodiment, the bonding wire 210 is made of conductive metal, such as a malleable metal, but the invention is not limited thereto. It should be noted that in the LED package 200, the ground lead 204 must be electrically insulated from the first signal lead 202a and the second signal lead 202b. In other words, the ground lead 204 is electrically insulated from the LED chip 206. Thus, when the static electricity is transmitted through the ground lead 204, the LED chip 206 is not damaged by the static electricity.

In the embodiment, the first signal lead 202a of the LED package 200 is electrically connected with the first driving signal wiring 102a on the circuit board. The second signal lead 202b is electrically connected to the second driving signal wiring 102b, and the ground lead 204 is electrically connected with the ground wiring 104. As shown in FIG. 2A, the signal current is transmitted through the first driving signal wiring 102a, the first signal lead 202a, the bonding wire 210, the second signal lead 202b, and the second driving signal wiring 102b electrically connected to the LED chip 206 so as to drives the LED chip 206 to emit light beams.

As shown in FIGS. 2A through 2D, the LED module of the embodiment can further comprise an encapsulation member 208. The encapsulation member 208 comprises a transparent encapsulation member 208a, and an opaque encapsulation member 208b. The opaque encapsulation member 208b is used to maintain the relative position of the first signal lead 202a, the second signal lead 202b, and the ground lead 204, to facilitate the die-bonding process. Usually, the opaque encapsulation member 208b has a cavity for exposing the inner lead portion of the first signal lead 202a, the second signal lead 202b, and the ground lead 204. The transparent encapsulation member 208a fills the cavity and encapsulates the LED chip 206, a partial area of the first signal lead 202a, a partial area of the second signal lead 202b, and a partial area of the ground lead 204. In the embodiment, the material of the transparent encapsulation member 208a is, for example, epoxy or silicone.

Referring to FIG. 2C, the outer lead portion of the first signal lead 202a and the second signal lead 202b are not encapsulated by the encapsulation member 208. The outer lead portion not encapsulated by the encapsulation member 208 comprises a first extending part P1 and a second extending part P2. The first extending part P1 extends downwards from the side wall of the encapsulation member 208, and extends towards the circuit board 100. The second extending part P2 is connected with the end of the first extending part P1 and extends laterally. For example, the second extending part P2 extends to the bottom of the encapsulation member 208. The second extending part P2 is electrically connected with the driving signal wiring 102a or the driving signal wiring 102b. However, the invention is not limited to the above-mentioned embodiments. According to another embodiment, the second extending part P2 can extend laterally in a direction away from the encapsulation member 208.

Please refer to FIG. 2D. The outer lead portion of the ground lead is not encapsulated by the encapsulation member 208. The outer lead portion not encapsulated by the encapsulation member 208 comprises a third extending part P3 and a fourth extending part P4. The third extending part P3 extends downwards from the side wall of the encapsulation member 208, and extends towards the circuit board 100. The fourth extending part P4 is connected with the end of the third extending part P3, and extends laterally. For example, the second extending part P2 extends to the bottom of the encapsulation member 208. The fourth extending part P4 is electrically connected with the ground wiring 104. However, the invention is not limited to the above-mentioned embodiments. According to another embodiment, the fourth extending part P4 can extend laterally in a direction away from the encapsulation member 208.

It should be noted that, since the extending part P3 of the ground lead 204 extends downward, height difference (or namely z-axis direction height difference) between the ground lead 204 and each wiring on the circuit board 100 is occurred. As such, when static electricity which is not discharged laterally (e.g. static electricity discharged in the vertical direction or static electricity discharged in another direction not parallel to the x-y plane) transmits to the vicinity of the LED package 200, the static electricity is conducted to the ground wiring 104 through the ground lead 204 so as to successfully protect the LED chip 206 from damage resulted from ESD. In addition, compared to the first signal lead 202a and the second signal lead 202b, the ground lead 204 has a lower resistance because the ground lead 204 is not electrically connected to the LED chip 206. When static electricity which is not discharged laterally (e.g. static electricity discharged in the vertical direction or static electricity discharged in another direction not parallel to the x-y plane) transmits to the vicinity of the LED package 200, the static electricity is conducted to the ground wiring 104 through the ground lead 204, and substantially reduces the chance of the static electricity to be directly transmitted through the first signal lead 202a and the second signal lead 202b.

In the embodiment, the resistance of the ground lead 204 can be designed as lower than the resistance of the other signal leads. As such, an improved electrostatic discharge (ESD) protection effect is achieved. In detail, in order to make the resistance of the ground lead 204 lower than the resistance of the first signal lead 202a and the resistance of the second signal lead 202b, the width W (or namely short side, shown in FIG. 2B) of the ground lead 204 of can be substantially wider than the width of the first signal lead 202a and the width of the second signal lead 202b. As such, the ground lead 204 can provide favorable electrostatic discharge (ESD) protection performance.

In another embodiments of the invention, the third extending part P3 of the ground lead 204 can be bent by forming process such that the third extending part P3 is higher than the first extending part P1 of the first signal lead 202a and the second signal lead 202b. Accordingly, ability of electrostatic discharge (ESD) protection of the ground lead 204 can be enhanced.

Figure 3:
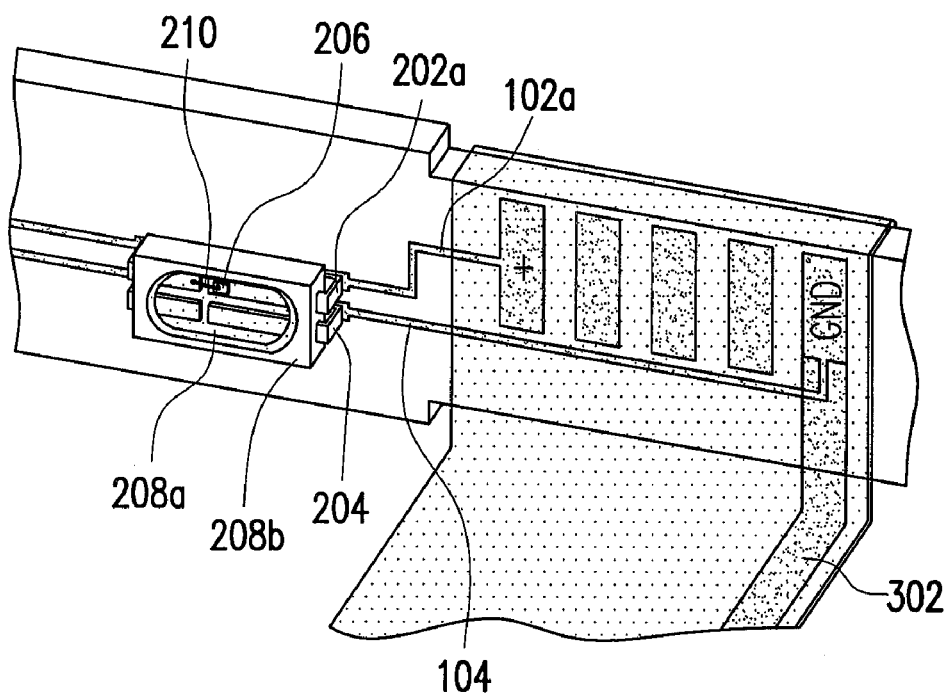
FIG. 3 is a three-dimensional schematic view of an LED module according to an embodiment of the invention.

FIG. 3 is a three-dimensional schematic view of an LED module according to an embodiment of the invention. Referring to FIG. 3, the LED module of the embodiment further includes a flexible printed circuit 302. In the embodiment, the flexible printed circuit 302 is electrically connected to the ground wiring 104. Thus, the flexible printed circuit conducts the static electricity transmitted by the ground wiring 104 to a holder or to other ground terminals of the LED module. As such, when static electricity which is not discharged laterally (e.g. static electricity discharged in the vertical direction or static electricity discharged in another direction not parallel to the x-y plane), the static electricity has a greater chance of transmitting to a ground terminal through the ground lead 204, the ground wiring 104, and the flexible printed circuit 302. According, the LED chip 206 is not easily damaged by the static electricity.

Since the ground lead of the application protrudes from the surface of the circuit board, static electricity that is not discharged laterally (e.g. static electricity discharged in the vertical direction or static electricity discharged in another direction not parallel to the x-y plane) has few possibility to pass through the LED chip. Accordingly, the present application provides favorable electrostatic discharge (ESD) protection.

It will be apparent to those skilled in the art that various modifications and variations can be made to the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode (LED) module comprising: a circuit board comprising a plurality of driving signal wirings and at least one ground wiring; and at least one LED package disposed on the circuit board and electrically connected to the driving signal wirings, each the at least one LED package comprising: at least one LED chip; a plurality of signal leads electrically connected to each of the at least one LED chip; and at least one ground lead electrically insulated from the signal leads and electrically connected to the at least one ground wiring; an encapsulation member encapsulating each the at least one LED chip, a partial area of the signal leads, and a partial area of the at least one ground lead, wherein the partial area of each of the signal leads not encapsulated by the encapsulation member comprises a first extending part extending downwards from a side wall of the encapsulation member and a second extending part connected with the first extending part, the second extending part extends laterally and the second extending part is electrically connected with the driving signal wirings, and the partial area of each of the at least one ground lead not encapsulated by the encapsulation member comprises a third extending part extending downwards from the side wall of the encapsulation member and a fourth extending part connected with the third extending part, the fourth extending part extends laterally, the fourth extending part is electrically connected with at least one of the at least one ground wiring, and the third extending part of the at least one ground lead is higher in vertical height than the first extending part of the signal leads.

2. The LED module of claim 1, wherein driving signal wirings of the plurality of driving signal wirings for each of the at least one LED package comprise a first driving signal wiring and a second driving signal wiring, and the signal leads comprise a first signal lead and a second signal lead, the first signal lead is electrically connected to the first driving signal wiring, and the second signal lead is electrically connected to the second driving signal wiring.

3. The LED module of claim 1, wherein a resistance of the at least one ground lead is lower than a resistance of each signal lead.

4. The LED module of claim 1, wherein an amount of the at least one ground lead is greater or equal to two.

5. The LED module of claim 1, further comprising a flexible printed circuit electrically connected to the at least one ground wiring.

6. The LED module of claim 1, wherein the at least one ground lead is electrically insulated from each of the at least one LED chip.

* * * * *